United States Patent
Nagasaku

(10) Patent No.: US 10,243,525 B2
(45) Date of Patent: Mar. 26, 2019

(54) POWER AMPLIFIER AND RADIO TRANSMITTER

(71) Applicant: Hitachi Kokusai Electric Inc., Tokyo (JP)

(72) Inventor: Toshiyuki Nagasaku, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/580,724

(22) PCT Filed: Jun. 15, 2015

(86) PCT No.: PCT/JP2015/067142
§ 371 (c)(1),
(2) Date: Dec. 8, 2017

(87) PCT Pub. No.: WO2016/203512
PCT Pub. Date: Dec. 22, 2016

(65) Prior Publication Data
US 2018/0167042 A1    Jun. 14, 2018

(51) Int. Cl.
| | |
|---|---|
| H03F 1/07 | (2006.01) |
| H03F 3/21 | (2006.01) |
| H03F 1/32 | (2006.01) |
| H03F 3/195 | (2006.01) |
| H03F 3/213 | (2006.01) |

(Continued)

(52) U.S. Cl.
CPC ........... *H03F 3/211* (2013.01); *H03F 1/0288* (2013.01); *H03F 1/3205* (2013.01); *H03F 3/195* (2013.01);

(Continued)

(58) Field of Classification Search
CPC .................... H03F 1/07; H03F 1/0288
(Continued)

(56) References Cited

U.S. PATENT DOCUMENTS 7,589,589 B2 * 9/2009 Kusunoki ............ H03F 1/0277
330/124 R
7,602,241 B2 * 10/2009 Suzuki .................. H03F 1/0288
330/124 R (Continued)

FOREIGN PATENT DOCUMENTS

| JP | 2000-059152 A | 2/2000 |
|---|---|---|
| JP | 2005-516515 A | 6/2005 |
| JP | 2012-029239 A | 2/2012 |

OTHER PUBLICATIONS

International Search Report of PCT/JP2015/067142 dated Aug. 25, 2015.

*Primary Examiner* — Henry Choe
(74) *Attorney, Agent, or Firm* — Mattingly & Malur, PC

(57) ABSTRACT

A power amplifier includes a carrier amplifier that operates from when an input signal is small, a peak amplifier that starts to operate when the input signal becomes large, a phase adjusting circuit that adjusts phases of an output of the carrier amplifier and an output of the peak amplifier, an impedance transforming line that transforms a load of the carrier amplifier when the input signal is small, and has a characteristic impedance close to an optimum load impedance of the carrier amplifier, and a circuit that is arranged between the output of the carrier amplifier and the impedance transforming line and reduces an output capacitance of the carrier amplifier.

9 Claims, 11 Drawing Sheets

(51) Int. Cl.
*H04B 1/04* (2006.01)
*H03F 1/02* (2006.01)
*H03H 7/38* (2006.01)

(52) U.S. Cl.
CPC .......... *H03F 3/213* (2013.01); *H04B 1/0475* (2013.01); *H03F 2200/267* (2013.01); *H03F 2200/336* (2013.01); *H03F 2200/387* (2013.01); *H03F 2200/423* (2013.01); *H03F 2200/451* (2013.01); *H03F 2200/541* (2013.01); *H03F 2203/21139* (2013.01); *H03F 2203/21172* (2013.01); *H03H 7/38* (2013.01); *H04B 2001/0425* (2013.01)

(58) Field of Classification Search
USPC .............................................. 330/124 R, 295
See application file for complete search history.

(56) References Cited

U.S. PATENT DOCUMENTS

| | | | | |
|---|---|---|---|---|
| 7,646,248 B2* | 1/2010 | Yang | ...................... | H03F 1/0288 330/124 R |
| 7,973,600 B2* | 7/2011 | Yu | .......................... | H03F 1/0288 330/124 R |
| 9,496,836 B2* | 11/2016 | Qureshi | .................. | H03F 3/193 |
| 2002/0135425 A1* | 9/2002 | Kim | ...................... | H03F 1/0288 330/295 |
| 2004/0056723 A1* | 3/2004 | Gotou | ................... | H03F 1/0288 330/295 |
| 2005/0083723 A1 | 4/2005 | Blednov et al. | | |
| 2006/0097783 A1* | 5/2006 | Okubo | ................... | H03F 1/0288 330/124 R |

* cited by examiner

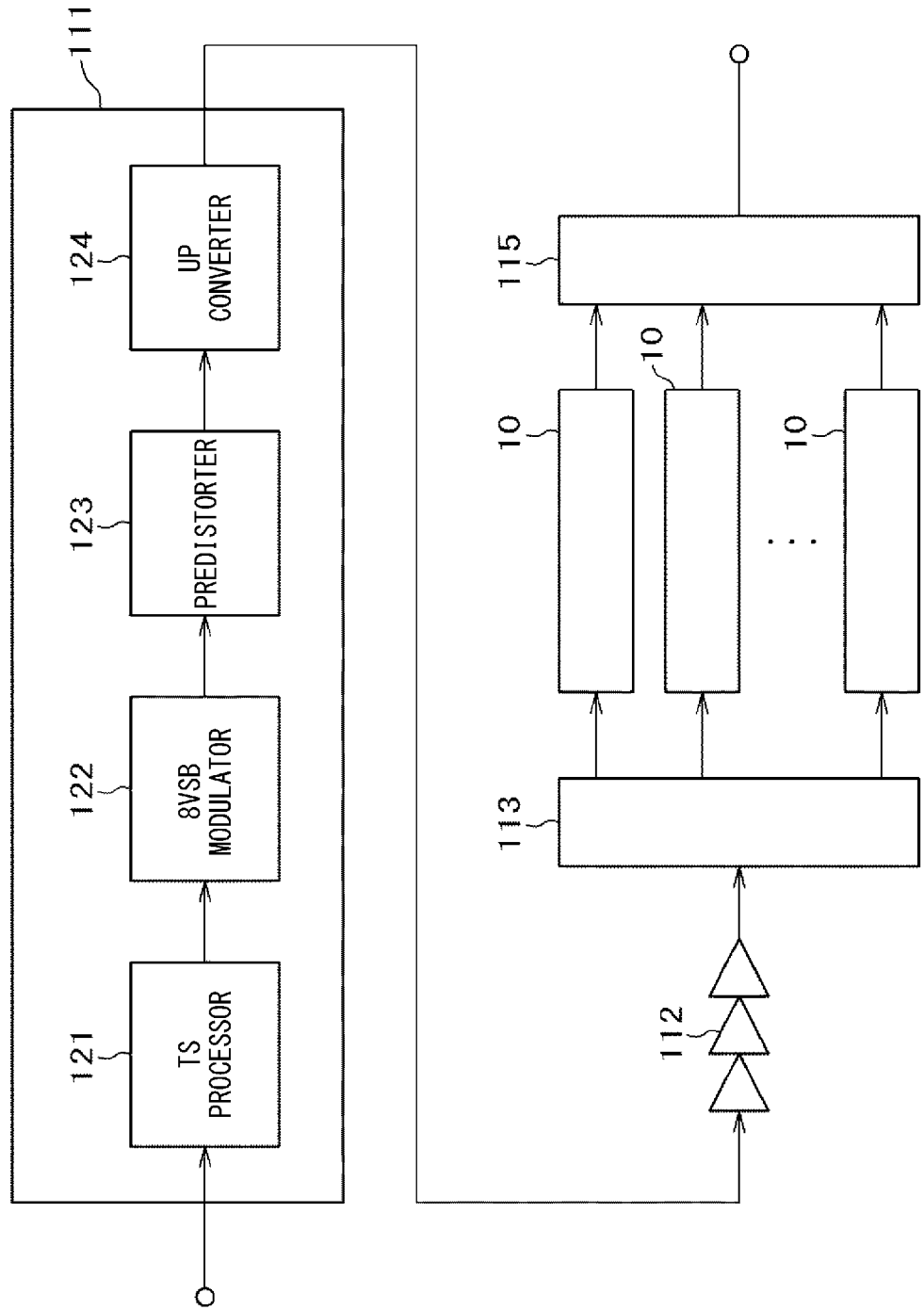

POWER AMPLIFIER AND RADIO TRANSMITTER

TECHNICAL FIELD

The present disclosure relates to a power amplifier and can be applied to a wideband Doherty amplifier, for example.

BACKGROUND ART

In order to amplify an electric signal to a predetermined level, various amplifiers are used in an electric circuit or an electronic circuit. An amplifier among them, which is mainly used as a final stage amplifier of a transmitter and has large output power, is referred to as a power amplifier.

Since transmission output is increased in a radio or the like for performing communication over a wide range, the output power of the power amplifier used in the transmitter is also increased. Therefore, power consumed by this power amplifier becomes very large, thus occupying large percentage in power consumed by the entire transmitter. Accordingly, in order to reduce the power consumption of the transmitter, reduction of the power consumption of the power amplifier, i.e., increase of efficiency is an important development issue.

Generally, a transistor used in an amplifier is more efficient at near saturation as compared with when an output signal level is low, and that efficiency is called saturation efficiency. On the other hand, in recent wireless communication, there is a tendency to adopt an advanced digital modulation scheme, such as OFDM (Orthogonal Frequency-Division Multiplexing), for the purpose of efficient use of frequencies. For a signal obtained in such a scheme, a ratio of maximum power and average power (PAPR: Peak to Average Power Ratio) is very large. In a power amplifier, with regard to saturation power of a transistor to be used, it is necessary to consider the maximum power of a signal in order to suppress distortion of a signal waveform. Therefore, the power amplifier operates at the average power much smaller than the saturation power, and its efficiency tends to be very low with respect to the saturation efficiency.

Various methods have been devised as a way to achieve high efficiency of the power amplifier. Among them, a Doherty amplifier has started to be adopted as a power amplifier suitable for achieving high efficiency for a signal with large PAPR in power amplifiers for various uses in recent years.

CITATION LIST

Patent Literature

Patent Literature 1: Japanese Unexamined Patent Application Publication No. 2012-29239
Patent Literature 2: Japanese Translation of PCT International Publication No. 2005-516515

SUMMARY OF INVENTION

Technical Problem

A problem of the present disclosure is to provide a technique, in a power amplifier using a transistor with a large output capacitance, which can reduce an effect of the output capacitance in a wider band.

Solution to Problem

The summary of a typical one of the present disclosures is briefly described below.

A power amplifier includes:
a carrier amplifier that amplifies an input signal;
a peak amplifier that starts to amplify the input signal when a signal level of the input signal becomes a predetermined level or more;
a phase adjusting circuit that adjusts phases of an output of the carrier amplifier and an output of the peak amplifier;
an impedance transforming line that transforms a load of the carrier amplifier when the signal level of the input signal is lower than the predetermined level;
a first inductance having one terminal coupled to an output of a first transistor forming the carrier amplifier and another terminal grounded in an alternating-current manner; and
a serial resonant circuit in which a second inductance and a first capacitance are coupled in series between the output of the first transistor and the impedance transforming line, wherein
the impedance transforming line has an approximately equal characteristic impedance to an optimum load impedance of the carrier amplifier at a coupling point of the impedance transforming line and the serial resonant circuit when the signal level is the predetermined level or more.

The characteristic impedance is approximately equal to or close to an impedance obtained by moving an optimum load impedance of the carrier amplifier when the signal level is maximum or when the output of the peak amplifier and the output of the carrier amplifier are equal to each other or when maximum output power is obtained, to near a real axis by the first inductance and the serial resonant circuit, but is different or approximately twice as far as from an impedance obtained by moving an optimum load impedance of the carrier amplifier when the signal level is less than the predetermined level or when the peak amplifier does not operate or when maximum power efficiency is obtained, to near the real axis by the first inductance and the serial resonant circuit.

Advantageous Effects of Invention

According to the above power amplifier, it is possible to reduce an effect of an output capacitance in a wider band.

BRIEF DESCRIPTION OF DRAWINGS

FIG. 13 is a block diagram of a radio transmitter according to a fourth example.

DESCRIPTION OF EMBODIMENTS

Embodiments and examples are described below with reference to the drawings. However, in the following description, the same components are labeled with the same reference signs and repetition of the description may be omitted.

Figure 1:
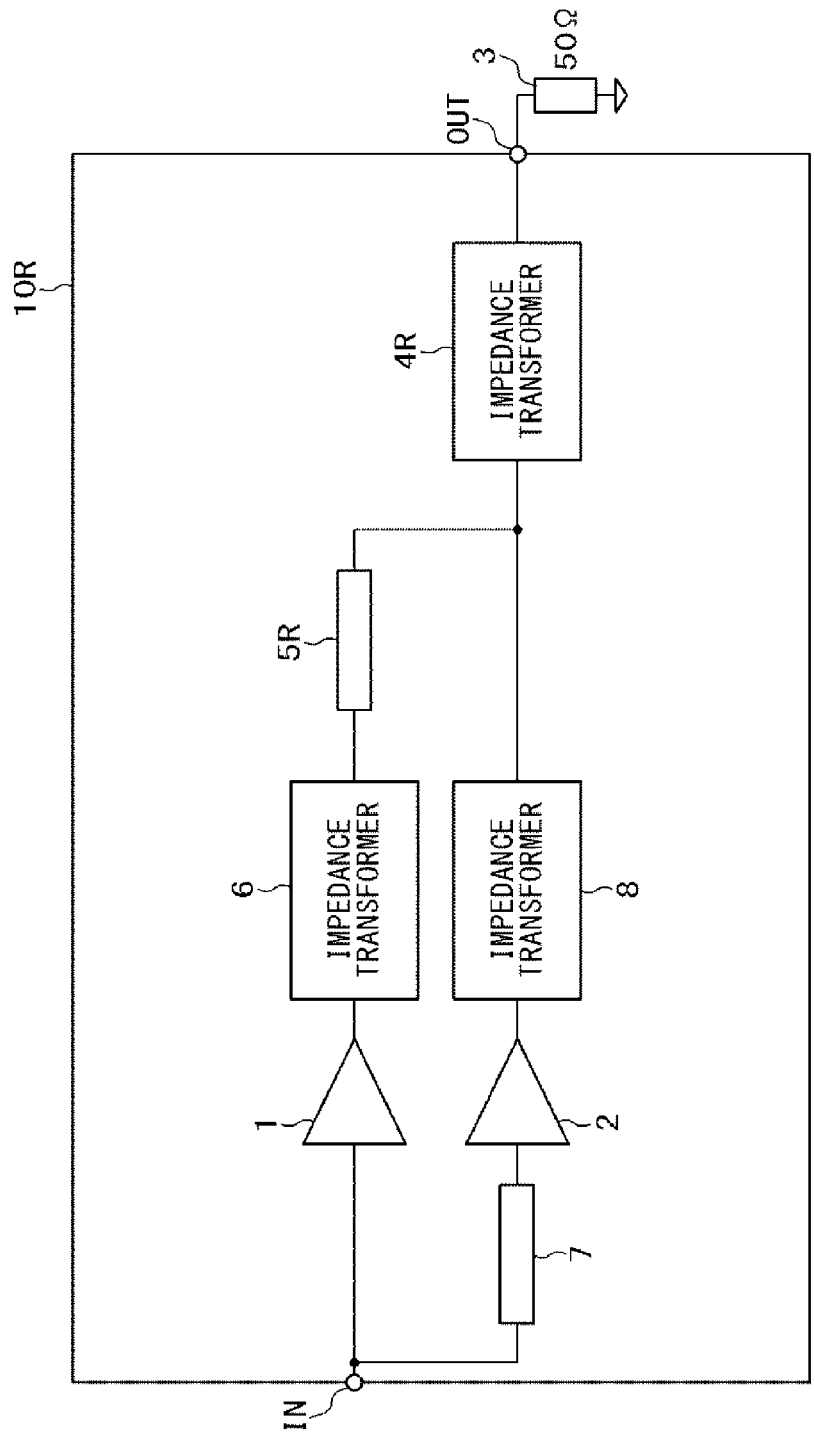
FIG. 1 is a block diagram for explaining the configuration of a usual Doherty amplifier.
Figure 2:
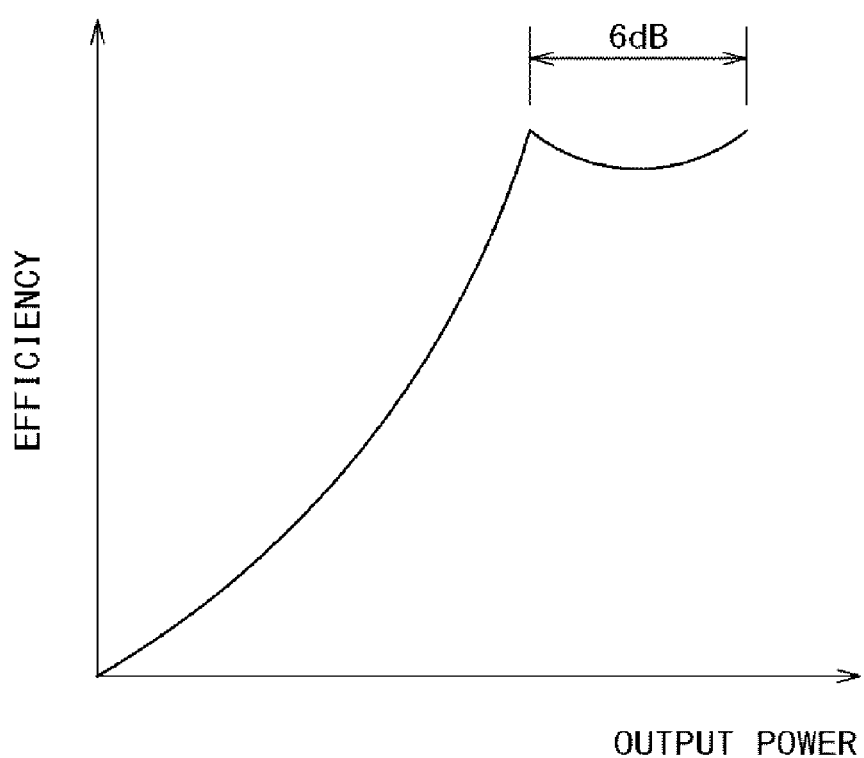
FIG. 2 is a diagram for explaining efficiency characteristics of a Doherty amplifier.
Figure 3:
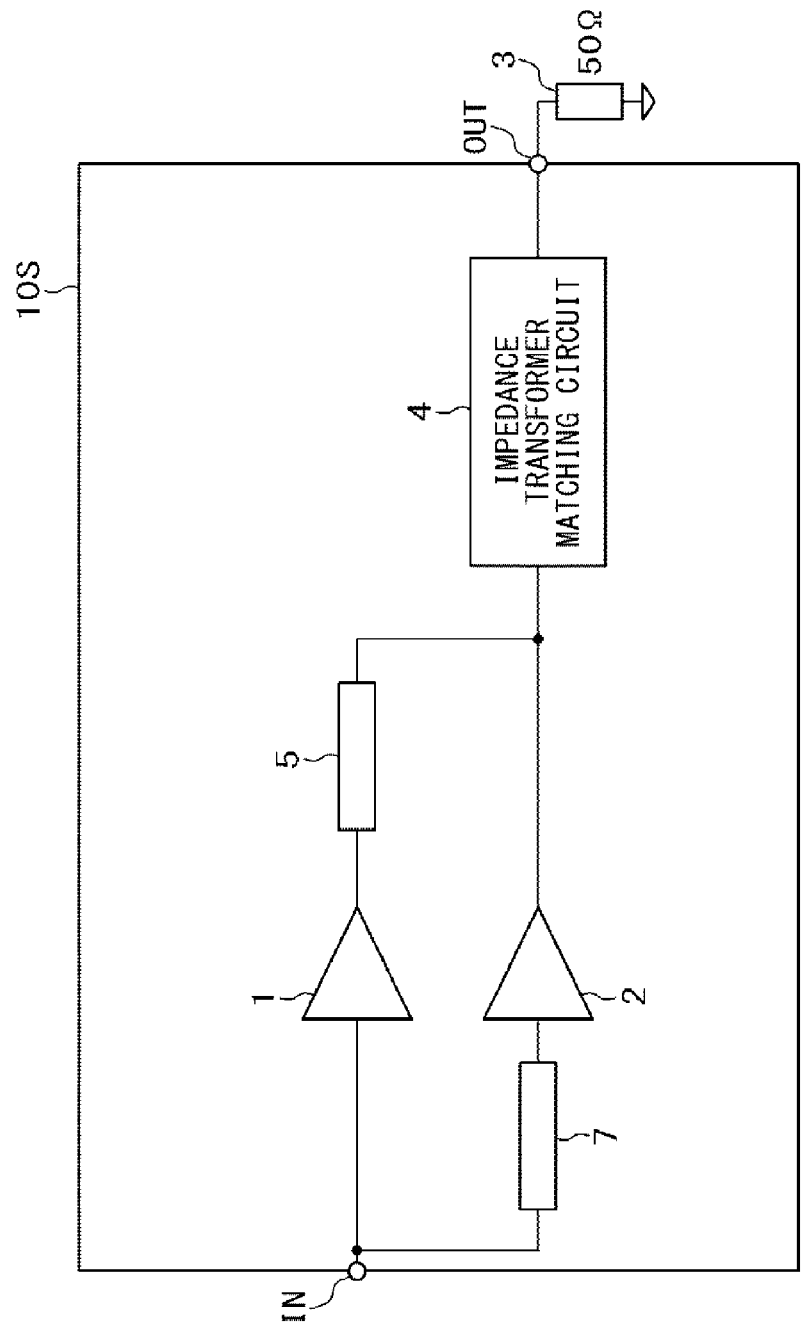
FIG. 3 is a block diagram for explaining the configuration of a Doherty amplifier with wideband characteristics.

First, a Doherty amplifier and its problem are described. FIG. 1 is a block diagram illustrating the configuration of a usual Doherty amplifier. FIG. 2 illustrates the efficiency characteristics of the Doherty amplifier. FIG. 3 is a block diagram illustrating the configuration of a Doherty amplifier with wideband characteristics.

A Doherty amplifier 10R illustrated in FIG. 1 is formed by two amplifiers including a carrier amplifier 1 and a peak amplifier 2. The carrier amplifier 1 and the peak amplifier 2 are amplifying elements, such as LD MOS FETs, which are separate from each other or are packaged integrally with each other. Typically, the carrier amplifier 1 is biased in class A or class AB and the peak amplifier 2 is biased in class B or class C. Further, in a 50-ohm system, a load 3 of the amplifier is often 50 ohms. An operation of the Doherty amplifier 10R is briefly described below.

When a level of a signal input to an input terminal IN of the Doherty amplifier 10R is low, the peak amplifier 2 is in an off-state and only the carrier amplifier 1 operates. An output impedance of the peak amplifier 2 in this state is designed to be very high (ideally infinite). Also, an output of an impedance transforming circuit (IMPEDANCE TRANSFORMER) 8 has a high impedance. Therefore, a state at this time is equivalent to a configuration in which only an impedance transforming circuit (IMPEDANCE TRANSFORMER) 4R is coupled to the carrier amplifier 1 and an impedance transforming circuit (IMPEDANCE TRANSFORMER) 6 via a λ/4 transmission line 5R. The impedance transforming circuit 4R transforms the 50-ohm load 3 of an output terminal OUT to 25 ohms at a coupling point of the peak amplifier 2 and the carrier amplifier 1. This impedance is transformed to 100 ohms via the λ/4 transmission line 5R with a characteristic impedance of 50 ohms, and therefore an amplifier formed by the carrier amplifier 1 and the impedance transforming circuit 6 operate at a 100-ohm load.

When the level of the signal input to the Doherty amplifier 10R becomes equal to or higher than a predetermined level, the peak amplifier 2 starts to operate, so that both the carrier amplifier 1 and the peak amplifier 2 operate. A λ/4 transmission line (phase adjustment line) 7 is adjusted in such a manner that outputs of both the carrier amplifier 1 and the peak amplifier 2 are combined with each other in phase. Since the impedance transforming circuit 4R transforms the 50-ohm load 3 to 25 ohms, a state at this time is equivalent to a configuration in which a 50-ohm load is coupled to each of the carrier amplifier 1 and the peak amplifier 2.

In this state, by adjusting the bias of the peak amplifier 2 in such a manner that the peak amplifier 2 starts to operate at a timing at which the carrier amplifier 1 is saturated, the efficiency of the Doherty amplifier 10R becomes characteristics illustrated in FIG. 2. As illustrated in FIG. 2, only the carrier amplifier 1 operates in a region where the input signal is small and, even in a case of a modulation signal with a large PAPR, its average output power comes close to saturation power of the carrier amplifier alone. Therefore, a highly efficient operation can be achieved.

In recent years, mobile phone base stations use various frequency bands from the 700 MHz band to the 2 GHz band, and it is desired that a single device can support a plurality of bands. Therefore, to widen the bandwidth of the device is an important issue. Further, in terrestrial digital broadcasting, channels are assigned to a UHF (Ultra High Frequency) band from 400 MHz to 800 MHz. Since it is effective to achieve a transmitter capable of supporting all the channels in these bands by one model from viewpoints of management of the stock, the cost, and the like, to widen the bandwidth of the transmitter has been expected.

The Doherty amplifier 10R uses the impedance transforming circuits 6 and 8 for matching the output impedances of the carrier amplifier 1 and the peak amplifier 2 and the impedance of the load each other. Due to the presence of the frequency characteristics of the impedance transforming circuits 6 and 8, desired impedance transformation is performed at a particular frequency point. However, the obtained impedance is deviated from an ideal impedance at a frequency point away from the center frequency. Because of this, the frequency range in which the Doherty amplifier 10R operates is limited. Furthermore, since the frequency characteristics of the impedance transforming circuits 6 and 8 and the frequency characteristics of the λ/4 transmission line 5R, and, further, the frequency characteristics of the impedance transforming circuit 4R affect one another to limit the frequency range in which an operation as a Doherty amplifier is achieved, it is difficult to widen the bandwidth in the Doherty amplifier 10R.

In order to widen the bandwidth of a Doherty amplifier, a method can be considered in which the output signals of the carrier amplifier 1 and the peak amplifier 2 are combined with each other without using any impedance transforming circuit, as illustrated in FIG. 3. In the configuration of a Doherty amplifier 10S of FIG. 3, no impedance transforming circuit is used after the outputs of the carrier amplifier 1 and the peak amplifier 2. Therefore, it is necessary to set the characteristic impedance of a λ/4 transmission line to a value close to an optimum load impedance (Zopt) of a transistor to be used in each of the carrier amplifier 1 and the peak amplifier 2. When a level of a signal input to the input terminal IN is low, the peak amplifier 2 is in an off-state and only the carrier amplifier 1 operates. Further, since the output impedance of the peak amplifier 2 becomes relatively high (ideally infinite), the carrier amplifier 1 is equivalent to the one coupled only to an impedance transformer matching circuit 4 via a λ/4 transmission line (impedance transforming line) 5. The impedance transformer matching circuit 4 transforms the 50-ohm load 3 of the output terminal OUT to Zopt/2. Therefore, in a range in which the input signal level is low, an impedance transformed to 2×Zopt by the λ/4 transmission line 5 with a characteristic impedance of Zopt is the load of the carrier amplifier 1.

When the input signal level becomes high, the peak amplifier 2 starts to operate, so that both the carrier amplifier 1 and the peak amplifier 2 operate. Since the phase adjustment line 7 is adjusted in such a manner that outputs of both amplifiers, i.e., the carrier amplifier 1 and the peak amplifier 2 are combined with each other in phase, the carrier amplifier 1 and the peak amplifier 2 operate at a load of Zopt.

In usual Doherty synthesis, the load impedance of a carrier amplifier when an input signal level is low is designed to be twice as large as the load impedance of the carrier amplifier or a peak amplifier when the input signal level is high. In the Doherty amplifier 10R, the load impedance of a carrier-amplifier side circuit formed by the carrier amplifier 1 and the impedance transforming circuit 6 and the load impedance of a peak-amplifier side circuit formed by the peak amplifier 2 and the impedance transforming circuit 8 are each 50 ohms when the input signal level is high, whereas the load impedance of the carrier-amplifier side circuit is 100 ohms when the input signal level is low.

However, because of presence of the impedance transforming circuit 6 between the carrier amplifier 1 and the λ/4 transmission line 5R in the Doherty amplifier 10R, it is difficult to maintain the load in the output of the carrier amplifier 1 when the input signal level is low to be twice as large as the load when the input signal level is high. Even if that relation can be maintained, the bandwidth for that relation is limited and therefore that relation is not suitable for widening the bandwidth.

The Doherty amplifier 10S also solves the above problem and, because no impedance transforming circuit is used in the outputs of the carrier amplifier 1 and the peak amplifier 2, the load impedances of the carrier amplifier 1 and the peak amplifier 2 are Zopt in a range where the input signal level is high, and the load impedance of the carrier amplifier 1 is 2×Zopt in a range where the input signal level is low.

Meanwhile, an FET (Field-Effect Transistor), a bipolar transistor, or the like is usually used in the carrier amplifier 1 and the peak amplifier 2. In these transistors, effects of an output capacitance and a parasitic component of the transistor cannot be ignored at frequencies in a microwave band. These effects are significant particularly in a high power transistor. Because of these effects, at a lead end of a package of the transistor, an optimum load impedance when an input signal level is low does not become twice as large as an optimum load impedance when the input signal level is high in some cases. Therefore, even if the circuit of the Doherty amplifier 10S is configured, the impedance when the input signal level is low does not become optimum, and a sufficient performance as a Doherty amplifier cannot be obtained.

Figure 4:
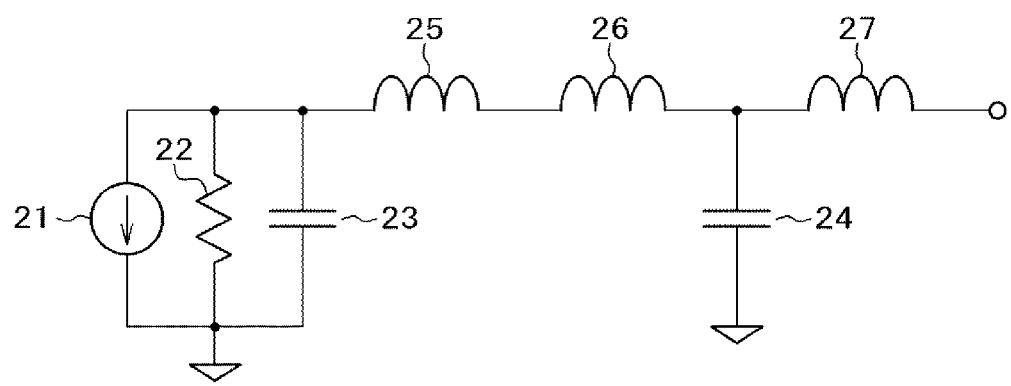
FIG. 4 is a diagram for explaining an equivalent circuit of an output portion of a usual high power transistor.

FIG. 4 illustrates an equivalent circuit on an output side of a usual high power transistor to be used in a microwave band. The output side of the transistor is formed by a current supply 21 that generates an output signal, an output resistance 22, and an output capacitance 23. Further, there are a parasitic inductance 25 by a bonding wire for coupling the main body of the transistor and a lead of a package, parasitic inductances 26 and 27 in a lead portion of the package, and a parasitic capacitance 24, for example. Although a more detailed equivalent circuit includes a parasitic inductance, a parasitic capacitance, a parasitic resistance, and the like by wiring inside the transistor, they are omitted here. In the equivalent circuit of FIG. 4, the output capacitance 23 is particularly very large, for example, is about 100 pF or is equal to or larger than 100 pF in a high power transistor to be used in a mobile phone base station and a transmitter for terrestrial digital broadcasting, and an effect of the output capacitance 23 on an optimum load impedance of the transistor becomes dominant as compared with other parasitic components. In fact, in an apparent output admittance (the reciprocal of the impedance when the transistor side is seen from the output lead) during an operation, the imaginary part is often larger in magnitude than the real part. In the following description, the parasitic inductances 25, 26, and 27 are ignored and only an output capacitance (Co), obtained by combining the output capacitance 23 and the parasitic capacitance 24 into one, is considered.

Figure 5:
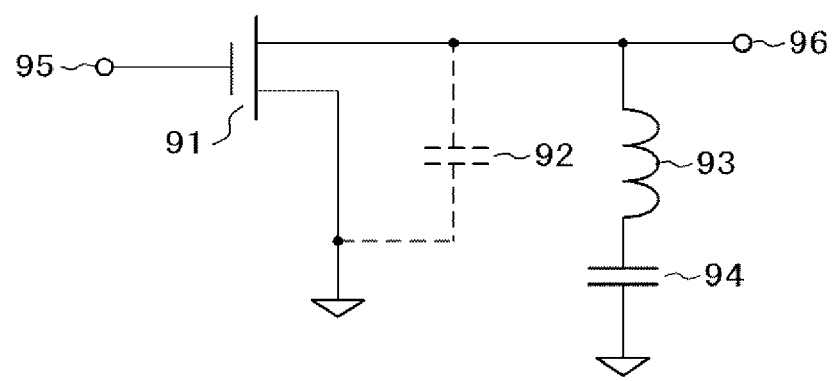
FIG. 5 is a diagram for explaining an amplifier having an inductance in an output of a transistor.

A method that reduces an output capacitance of an amplifier element by loading an inductance in an output portion of a transistor is described. FIG. 5 illustrates the configuration of an amplifier having an inductance in an output of a transistor. The amplifier of FIG. 5 includes a transistor 91, an input terminal 95, and an output terminal 96, and an inductance (Lp) 93 and a capacitance 94 are coupled between the drain terminal of the transistor 91 and the output terminal 96. A capacitance (Co) 92 illustrated with broken line in FIG. 5 expressly represents an output capacitance included inside the transistor 91 for the purpose of explanation. Typically, the capacitance 94 is set to be a sufficiently large capacitance value with respect to a signal frequency, and the inductance 93 is equivalent to an inductance grounded at the signal frequency. By choosing the inductance (Lp) 93 and the output capacitance (Co) 92 inside the transistor in such a manner that they resonate at a desired frequency, it is possible to reduce the effect of the output capacitance.

Figure 6:
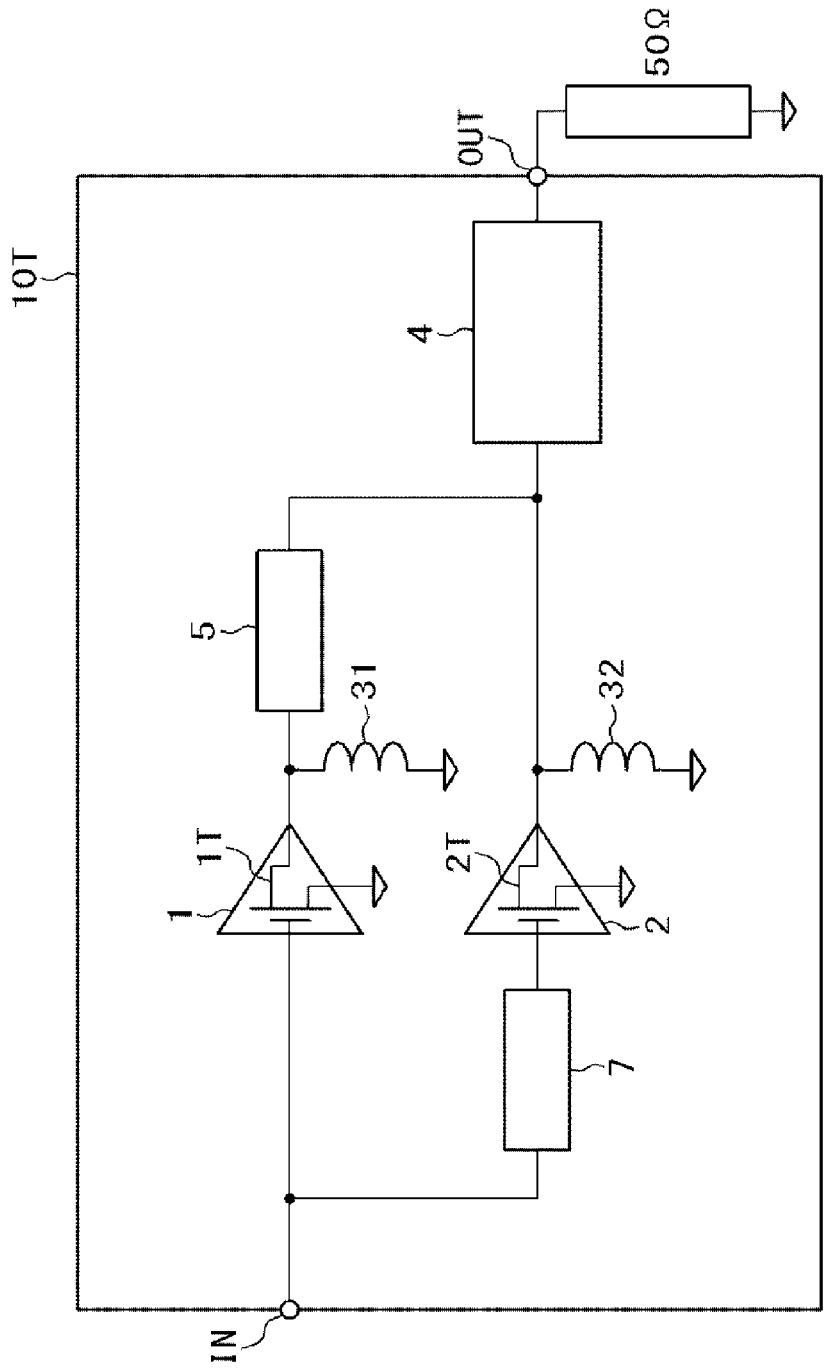
FIG. 6 is a block diagram for explaining the configuration of a Doherty amplifier having an inductance in an output of a transistor.

An example in which this method is applied to a Doherty amplifier is described. FIG. 6 is a block diagram illustrating the configuration of a Doherty amplifier having an inductance in an output of a transistor. As illustrated in FIG. 6, a Doherty amplifier 10T has an inductance 31 loaded at an output end of the carrier amplifier 1 and an inductance 32 loaded at an output end of the peak amplifier 2. The other configuration is the same as that of the Doherty amplifier 10S. The carrier amplifier 1 and the peak amplifier 2 include transistors 1T and 2T, respectively. An end of the inductance 31, opposite to one end of the inductance 31 coupled to the output end of the carrier amplifier 1, that is, the other end is grounded. The inductance 31 is coupled in parallel with an output capacitance of the transistor 1T. An end of the inductance 32, opposite to one end of the inductance 32 coupled to the output end of the peak amplifier 2, that is, the other end is grounded. The inductance 32 is coupled in parallel with an output capacitance of the transistor 2T. Although the output capacitance of the transistor 1T and the output capacitance of the transistor 2T are not illustrated, they are present at the same positions as those in FIG. 5. By loading the inductance 31 at the output end of the carrier amplifier 1, it is possible to reduce the effect of the output capacitance of the transistor to be used in the carrier amplifier 1 and to make the optimum load impedance when an input signal level is low close to twice the optimum load impedance when the input signal level is high.

However, since the output capacitance and the inductance 31 are caused to resonate in order to reduce the effect of the output capacitance in the Doherty amplifier 10T, it is not possible to sufficiently widen the bandwidth in which the output capacitance can be effectively reduced, in a case of using an inductance with a high Q-value. As a countermeasure against the above, there can be a method in which an element like a resistor is inserted or an inductance with a low Q-value is used, thereby reducing Q in resonance to widen the bandwidth. In this case, however, a loss is caused by the resistor or the inductance, so that the efficiency of the Doherty amplifier is largely reduced.

In a high power amplifier that is used in a mobile phone base station and a broadcasting system for terrestrial digital broadcasting and is used for high frequencies, such as those in a microwave band, the optimum load impedance when an input signal component is small does not become twice as large as the optimum load impedance when the input signal is large because of the effect of the output capacitance of the transistor to be used, as described before. Therefore, even if the Doherty amplifier is configured, a sufficient performance cannot be obtained.

Further, even if an inductance is loaded in an output of a transistor and the effect of the output capacitance is reduced as a countermeasure against the above, it is not possible to sufficiently widen the bandwidth.

<Embodiment>

Thus, an embodiment enables reduction of an effect of the output capacitance in a wider band in a case of configuring a Doherty amplifier by using a transistor with a large output capacitance, and enables favorable wideband characteristics to be achieved in the Doherty amplifier in which a load impedance when an input signal component is small is twice as large as a load impedance when the input signal is large. The Doherty amplifier according to the embodiment is described with reference to FIGS. 7 to 9.

Figure 7:
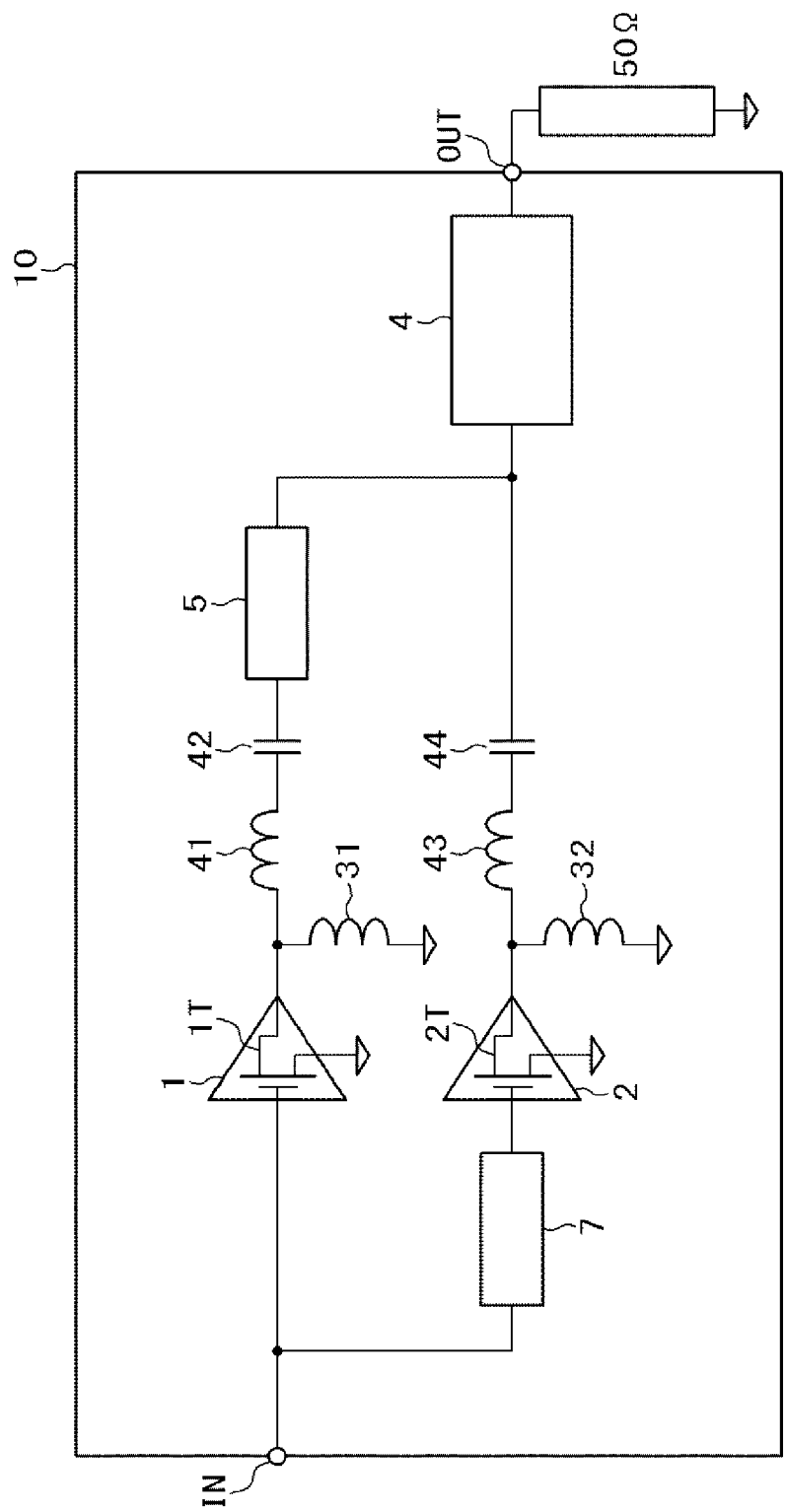
FIG. 7 is a block diagram for explaining the configuration of a Doherty amplifier according to an embodiment.

FIG. 7 illustrates the configuration of the Doherty amplifier according to the embodiment. In order to reduce the effect of the output capacitance of the carrier amplifier 1, a Doherty amplifier 10 that is a power amplifier includes the inductance (first inductance) 31 coupled in parallel with the output of the transistor 1T of the carrier amplifier 1, and additionally includes an inductance (second inductance) 41 and a capacitance (first capacitance) 42 coupled in series to the output of the transistor 1T. Also, the Doherty amplifier 10 includes the inductance 32 coupled in parallel with the output of the transistor 2T of the peak amplifier 2, and additionally includes an inductance 43 and a capacitance 44 coupled in series to the output of the transistor 2T. Since the inductance 31 is configured to be coupled in parallel with the output capacitance as in the Doherty amplifier 10T, a reactance component obtained by combining both the output capacitance and the inductance 31 becomes small and it is therefore possible to reduce the effect of the output capacitance. In particular, by setting an inductance value (L) to a value determined by the following expression (1), the output capacitance and the first inductance 31 resonate, so that the impedance becomes infinite. Thus, the output capacitance and the inductance are equivalent to a state in which they are not coupled to each other.

$$L = \frac{1}{C_0 \times (2\pi f_c)^2}$$ [Expression 1]

In the above expression (1), Co represents the output capacitance of the transistor and fc represents a center frequency. Further, assuming that a value of the inductance 41 is Ls and a value of the capacitance 42 is Cs, values close to the following expression (2) are used as Ls and Cs.

$$f_c = \frac{1}{2\pi \sqrt{L_S C_S}}$$ [Expression 2]

By the above setting, a combined impedance of the inductance 41 and the capacitance 42 becomes small at the center frequency (fc) and they do not affect the circuit of the Doherty amplifier 10. Therefore, it is possible to effectively reduce the effect of the output capacitance of the transistor by the inductance 31. Further, with regard to the frequency characteristics around the center frequency (fc), a reactance increases in association with increase of a frequency in a serial circuit (serial resonant circuit) formed by the inductance 41 and the capacitance 42, whereas the frequency characteristics of a parallel circuit (parallel resonant circuit) formed by the output capacitance of the carrier amplifier 1, the inductance 31, and the output resistance 22 become opposite characteristics, so that both the frequency characteristics are cancelled out each other. Therefore, it is possible to reduce the effect of the output capacitance in a wider band as compared with a case of using the inductance 31 only as in the Doherty amplifier 10T. Further, it is unnecessary to use a low-Q inductance or capacitance in the Doherty amplifier 10, and the Doherty amplifier 10 also does not use an element having a loss, such as a resistor element. Therefore, a wideband high-efficiency Doherty amplifier can be achieved. When an attention is paid to canceling out of the frequency characteristics, Ls and Cs are preferably chosen in such a manner that the imaginary parts of the respective frequency derivatives of the impedances (or admittances) of the above parallel circuit and the above serial circuit are approximately equal to each other in magnitude and are opposite to each other in sign. Alternatively, Ls and Cs can be chosen between a point at which the magnitudes in the derivatives of the impedances are equal to each other and a point at which the magnitudes in the derivatives of the admittances are equal to each other.

In the thus designed Doherty amplifier 10, the conductance (output resistance 22) of the transistor 1T does not vary even if it is seen from the output side of the capacitance 42. That is, a capacitance compensation circuit including the above parallel circuit and the above serial circuit does not function as an impedance transformer that transforms the conductance of the transistor 1T.

Figure 8:
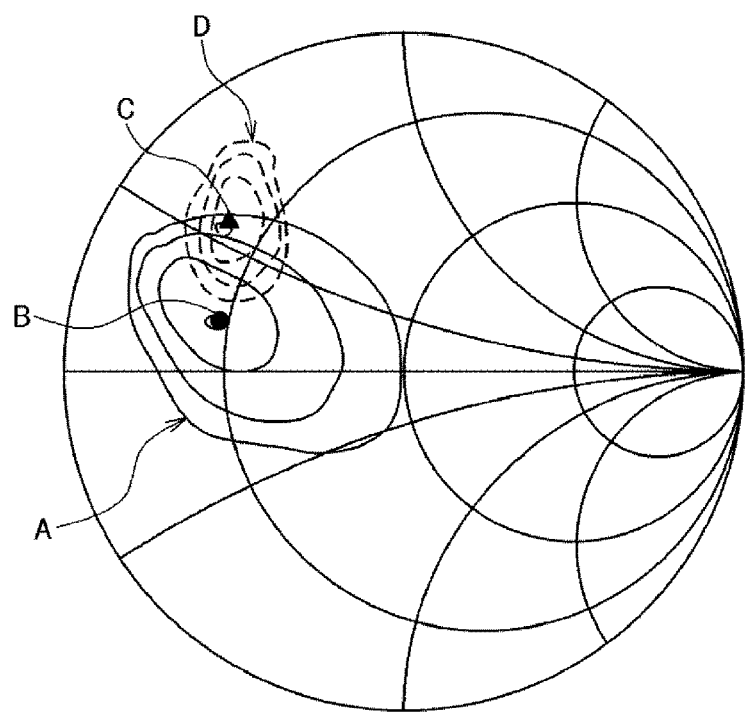
FIG. 8 is a Smith chart representing an optimum impedance of a transistor in the Doherty amplifier of FIG. 3.

FIG. 8 is a Smith chart illustrating an example of the optimum load impedance of the carrier amplifier 1 in the circuit of the Doherty amplifier 10S of FIG. 3. A triple closed curve illustrated with solid line A in FIG. 8 represents the optimum load circle with regard to output power. In order to obtain maximum output in a transistor that is being used, the load must be an impedance illustrated with a black circle point B. That is, in the Doherty amplifier, the load of the transistor when an input signal level is high is desirably the black circle point B. Meanwhile, a circle illustrated with broken line C is the optimum load circle with regard to efficiency. In order to obtain the efficiency characteristics as illustrated in FIG. 2 in the Doherty amplifier, it is desirable that, when the input signal level is low and only the carrier amplifier 1 operates, the carrier amplifier 1 obtains maximum efficiency at an output of −3 dB with respect to a peak output. In order to obtain such characteristics, the optimum load when the input signal level is low is a black triangle point C. The optimum load impedance has a positive imaginary part in accordance with the principle of conjugate matching (that is, is inductive), and it can be supposed that the inverted imaginary part of the Smith chart of FIG. 8 corresponds to an impedance (an output impedance) when the inside of the transistor illustrated by the equivalent circuit of FIG. 4 is seen from the output terminal of the transistor. As is apparent from FIG. 8, the relation between the black circle point B and the black triangle point C is not a relation in which one is twice as large as the other, considered in a usual Doherty amplifier. Therefore, the Doherty amplifier 10S of FIG. 3 cannot obtain sufficient characteristics.

Figure 9:
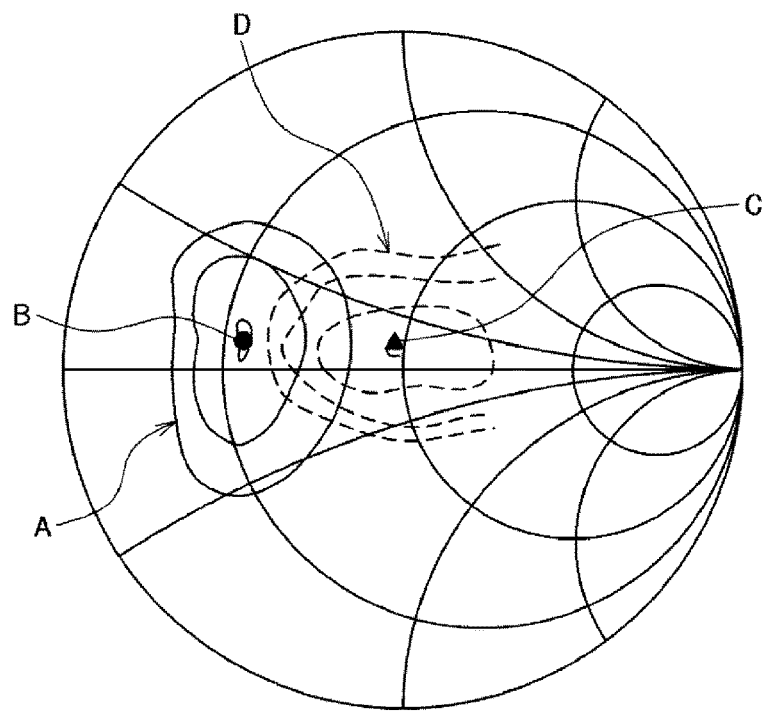
FIG. 9 is a Smith chart representing an optimum impedance of a transistor in the Doherty amplifier of FIG. 7.

FIG. 9 is a Smith chart illustrating an example of the optimum load impedance after capacitance compensation in the Doherty amplifier 10 of FIG. 7. This impedance is an impedance of the load coupled via the above parallel circuit and the above serial circuit, and the meanings of the black circle point B, the black triangle point C, the solid line A, and the broken line D in FIG. 9 are the same as those in FIG. 8. As is apparent from FIG. 9, after capacitance compensation by the inductances 31 and 41 and the capacitance 42, each of the original black circle point B and the original black triangle point C travels on its equivalent conductance circle counter-clockwise and reaches near a real axis. Although the reactance component remains slightly, the impedance at the black triangle point D is about twice as large as the impedance at the black circle point B, and an approximately ideal operation of a Doherty amplifier can be achieved.

In the present embodiment, the inductance and the capacitance are coupled to each of the carrier amplifier 1 and the peak amplifier 2 in order to improve circuit symmetry while both the carrier amplifier 1 and the peak amplifier 2 operate. However, since the impedance relation that is a problem of the above-described Doherty amplifier is necessary only for the carrier amplifier 1, the inductances 32 and 43 and the capacitance 44 on the peak amplifier side can be omitted if sufficient characteristics are obtained when the input signal level is high. The capacitances 42 and 44 are also useful for preventing the outputs of the transistors 1T and 2T from being coupled to each other in a direct-current manner. However, this effect can be also obtained by the capacitance 42 only.

According to the present embodiment, a circuit for reducing an effect of an output capacitance present in a transistor to be used in a carrier amplifier is inserted into an output portion of the transistor, thereby enabling the optimum load impedance when an input signal level is high and the optimum load impedance when the input signal level is low to become close to a relation of impedances of both the optimum load impedances achieved by a Doherty amplifier. Further, the circuit for reducing the effect of the output capacitance includes a first inductance loaded on the output of the transistor, and additionally includes a second inductance and a capacitance loaded in series. Thus, it is possible to reduce the effect of the output capacitance of the transistor in a wider band, so that a wider-band high-performance Doherty amplifier can be achieved.

FIRST EXAMPLE

Figure 10:
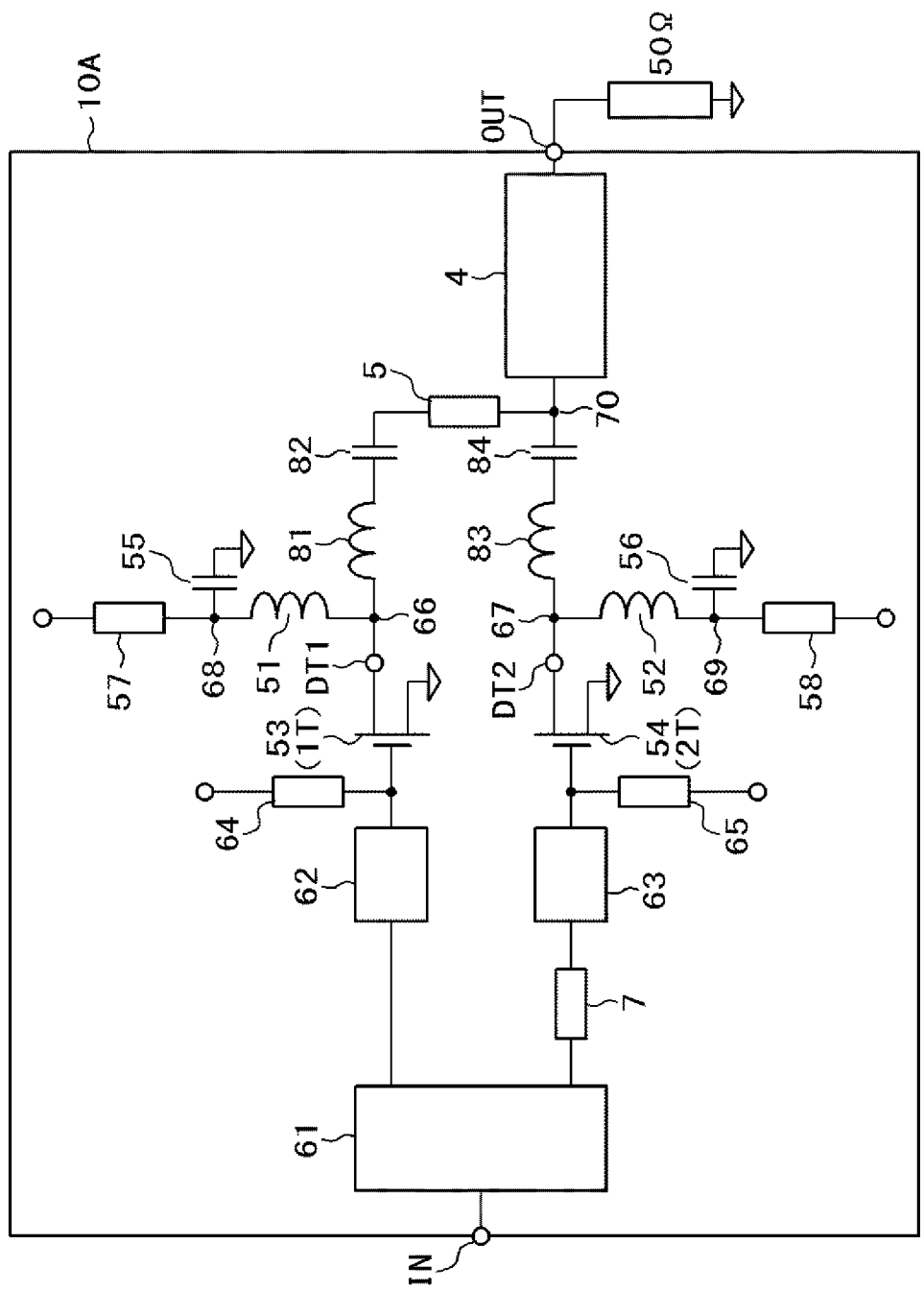
FIG. 10 is a block diagram for explaining the configuration of a Doherty amplifier according to a first example.

FIG. 10 illustrates the configuration of a Doherty amplifier according to a first example.

An input signal input to the input terminal IN of a Doherty amplifier 10A according to the first example is subjected to power distribution in a power distributing circuit 61 configured by a Wilkinson circuit or the like, and is then transformed to a desired impedance by matching circuits 62 and 63. Field Effect transistors (FETs) 53 and 54 respectively form the transistor 1T of the carrier amplifier 1 and the transistor 2T of the peak amplifier 2. To an output of the carrier amplifier 1 (FET 53) is coupled the $\lambda/4$ transmission line 5, not via an impedance transforming circuit. A bias voltage is applied to a gate of each of the FETs 53 and 54 via a corresponding one of power supply lines 64 and 65. The $\lambda/4$ transmission line 7 is arranged between the power distributing circuit 61 and the matching circuit 63, so that phase adjustment between the output of the carrier amplifier 1 and the output of the peak amplifier 2 is performed.

In the Doherty amplifier 10A, a circuit formed by an inductance (first inductance) 51, an inductance (second inductance) 81, and a capacitance (first capacitance) 82 and a circuit formed by an inductance (third inductance) 52, an inductance (a fourth inductance) 83, and a capacitance (fourth capacitance) 84 are circuits for reducing output capacitances of the transistors 1T and 2T, respectively. The inductances 51 and 52 are coupled to nodes 66 and 67 adjacent to (in the vicinity of) drain terminals DT1 and DT2 of the FETs 53 and 54, respectively. The inductances 51 and 52 each have a function for supplying a drain bias to the corresponding FET 53 or 54 via a corresponding power supply line 57 or 58. To the power supply lines 57 and 58, a power supply is coupled. To terminals 68 and 69 on the opposite side to the nodes 66 and 67 on the drain-terminal side of the inductances 51 and 52, a capacitance (first capacitance) 55 and a capacitance (third capacitance) 56 which are sufficiently large so that they can be regarded as being grounded at a signal frequency are coupled, respectively.

The FET 53 of the carrier amplifier 1 is biased in class A or class AB, and the FET 54 of and the peak amplifier 2 is biased in class B or class C. When an input signal is small, the peak amplifier 2 biased in class C does not operate, and only the carrier amplifier 1 operates. In this state, since the output impedance of the FET 54 of the peak amplifier 2 becomes very high, the impedance transformer matching circuit 4 is equivalent to the one to which only the carrier amplifier 1 is coupled. The impedance transformer matching circuit 4 transforms 50 ohms that is a circuit load to an impedance of Zopt/2 at a coupling point 70 of the carrier amplifier 1 and the peak amplifier 2, and this impedance is further transformed by the $\lambda/4$ transmission line 5 with a characteristic impedance of Zopt to 2×Zopt. When Zopt is set to the optimum load impedance at a peak output of the transistor while the inductances 51 and 52, the inductances 81 and 83, and the capacitances 82 and 84 are loaded, the optimum load impedance at this time is illustrated in FIG. 9. Thus, the charrier amplifier 1 can obtain favorable characteristics at an output lower than the peak output by 3 dB in a range in which the input signal level is low and only the carrier amplifier 1 operates. Further, by choosing the inductances 51 and 52 in such a manner that the relation with the output capacitance of the transistor satisfies the expression (1) and determining the inductances 81 and 82 and the capacitances 82 and 84 to satisfy the relation represented by the expression (2), the frequency characteristics of a circuit formed by the output capacitance of the transistor and the inductances 51 and 52 and the frequency characteristics of a circuit formed by the inductances 81 and 82 and the capacitances 83 and 84 have opposite trends to each other and cancel out each other. Therefore, it is possible to reduce the effect of the output capacitance in a wider band.

In order to obtain wideband characteristics, the impedance transformer matching circuit 4 has to transform an impedance of 50 ohms to Zopt/2 over a wide band. This can be achieved by an impedance transforming circuit formed by multiple $\lambda/4$ transmission lines or a Klopfenstein type impedance transforming circuit, for example.

By employing the above-described configuration, it is possible to reduce the effect of the output capacitance of the transistor, and to improve the characteristics of a Doherty amplifier. Furthermore, by combining the outputs of the peak amplifier 2 and the carrier amplifier 1 with each other via no impedance transforming circuit and performing impedance transformation after combining of both the signals in the wideband impedance transformer matching circuit 4 to obtain 50 ohms, it is possible to maintain the favorable characteristics over a wide band.

SECOND EXAMPLE

Figure 11:
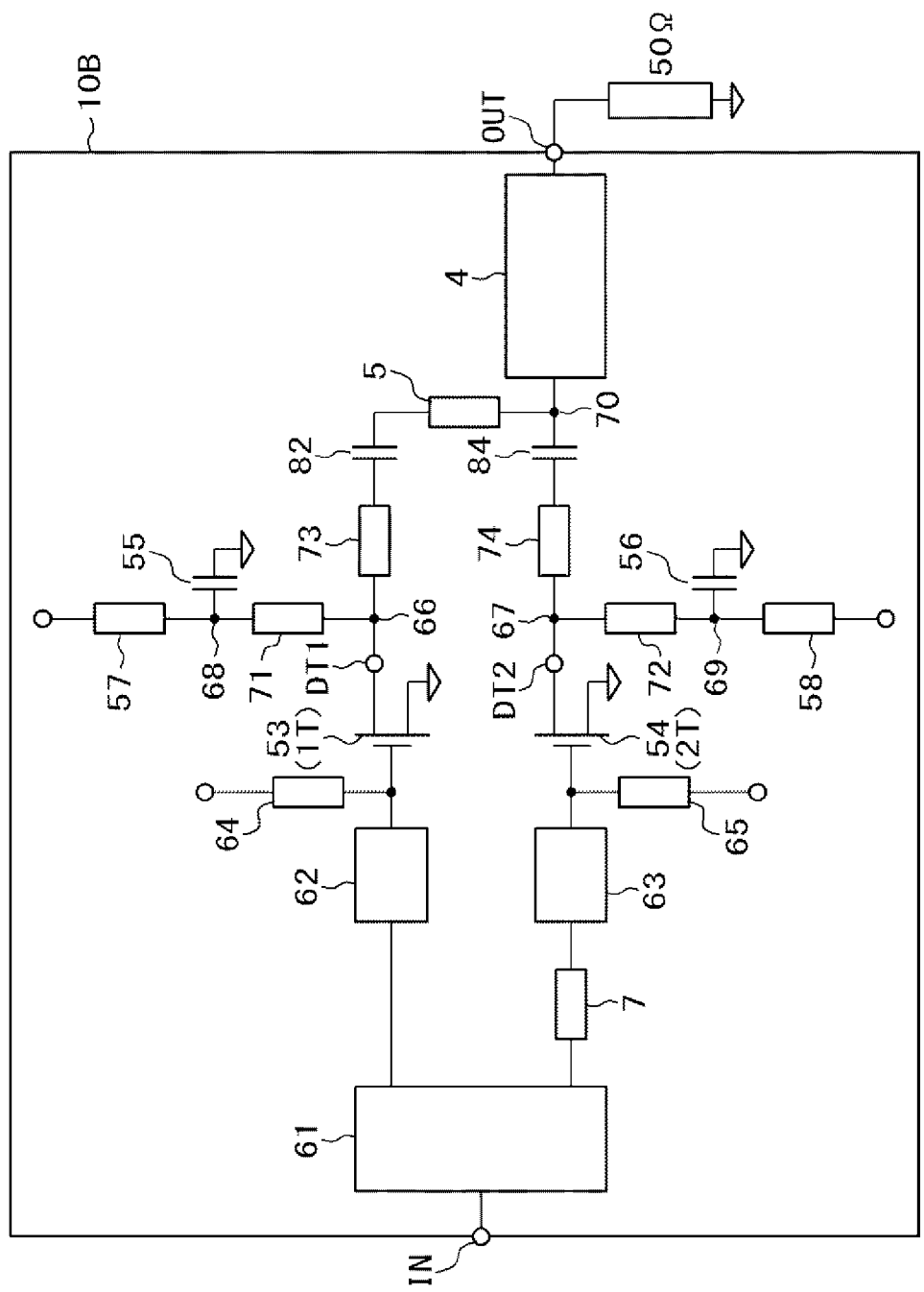
FIG. 11 is a block diagram for explaining the configuration of a Doherty amplifier according to a second example.

FIG. 11 illustrates the configuration of a Doherty amplifier according to a second example. A Doherty amplifier 10B according to the second example is an example in which inductances are simulated by transmission lines 71, 72, 73, and 74. The widths and the lengths of the transmission lines 71, 72, 73, and 74 are set to provide the same characteristics as the inductances 51, 52, 81, and 82 of the Doherty amplifier 10A of FIG. 10 at a center frequency. Also, the transmission lines 71 and 72 each have a function of supplying a drain bias via a corresponding one of the power supply lines 57 and 58, as in the Doherty amplifier 10A of FIG. 10. To the transmission lines 71 and 72, the sufficiently large capacitances 55 and 56 are coupled to allow the transmission lines 71 and 72 to be regarded as lines each grounded at its end at a signal frequency.

In the Doherty amplifier 10B, a transmission line simulating an inductance can be formed together with another transmission line on a printed circuit board with a transistor mounted thereon, thereby enabling reduction of the number of components, which results in reduction of the cost. In addition, it is desirable to use a high-Q inductance in the Doherty amplifier 10A of FIG. 10. However, since an actually available inductance has a finite Q-value, its effect cannot be ignored in some cases. In such cases, since no inductance is required in the Doherty amplifier 10B of FIG. 11, it is possible to configure a Doherty amplifier with higher efficiency.

THIRD EXAMPLE

Figure 12:
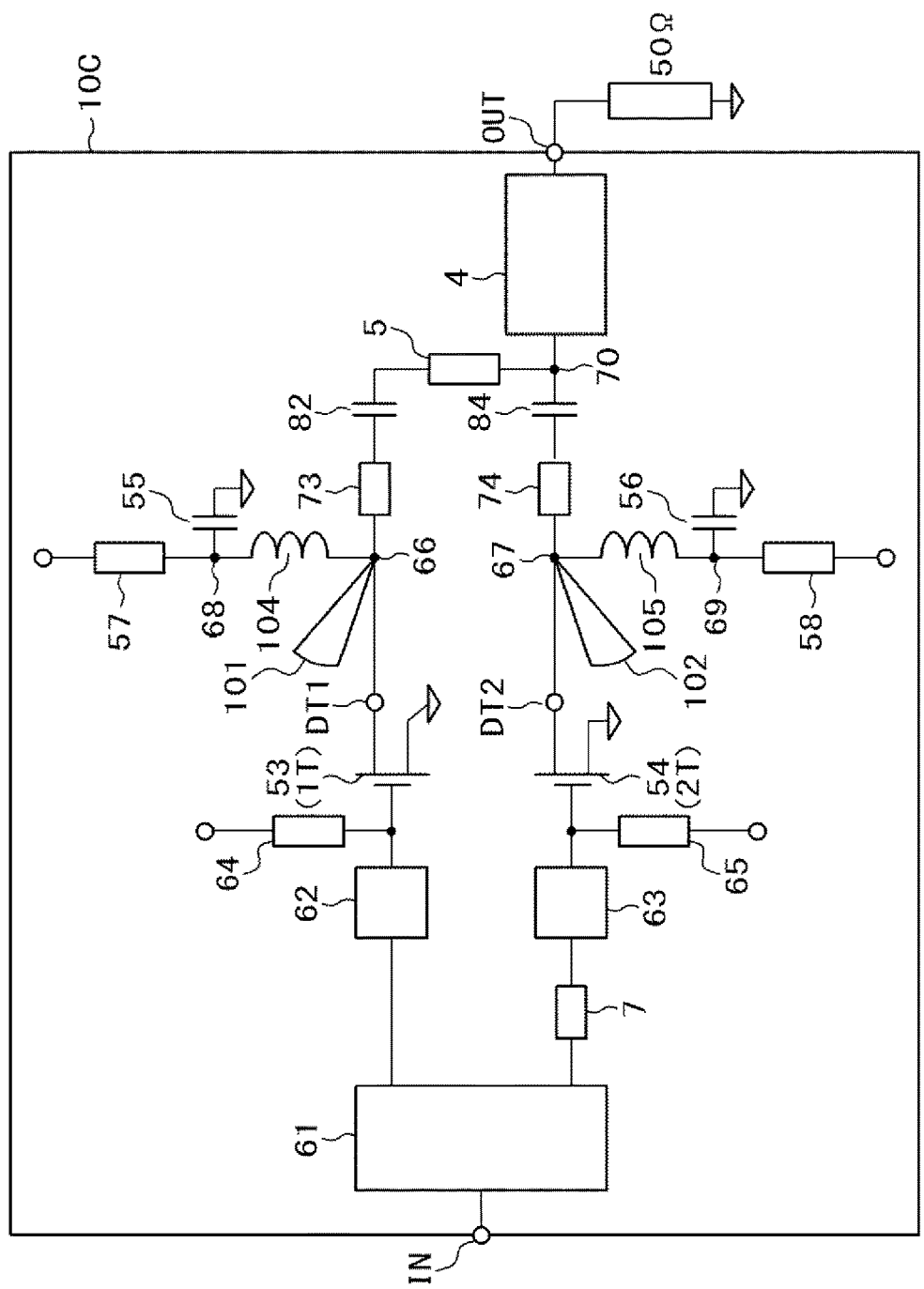
FIG. 12 is a block diagram for explaining the configuration of a Doherty amplifier according to a third example.

FIG. 12 illustrates the configuration of a Doherty amplifier according to a third example. A Doherty amplifier 10C according to the third example forms a circuit for reducing an output capacitance of a transistor by circuits respectively formed by radial stubs 101 and 102, the transmission lines 73 and 74, and the capacitances 82 and 84. The radial stubs 101 and 102 each have inductive characteristics when the radius is in a range from $\lambda/4$ to $\lambda/2$. Thus, by appropriately setting the radii of the radial stubs 101 and 102, the same characteristics as those of the inductances 51 and 52 in the Doherty amplifier 10A of FIG. 10 can be obtained. The transmission lines 73 and 74 and the capacitances 82 and 84 work in the same manner as those in the Doherty amplifier 10B of FIG. 11. An inductance (fifth inductance) 104 and an inductance 105 are each used for separating a power supply line from a signal, and an inductance with a large inductance value is used to provide a sufficiently high impedance with respect to a signal frequency.

Although the Doherty amplifier 10C uses the inductances 104 and 105, they are each used for separating the power supply line from the signal, not for forming a portion of the circuit for reducing the output capacitance of the transistor. Therefore, it is possible to suppress an effect of a Q-value of an inductance on the characteristics, as compared with the Doherty amplifier 10A of FIG. 10. Further, not only the Q-value of the inductance but also Q-values of the capacitances 55 and 56 in the Doherty amplifier 10A of FIG. 10 or the Doherty amplifier 10B of FIG. 11 may affect the characteristics. However, in a case of the Doherty amplifier 10C, no capacitance is required at ends of the radial stubs 101 and 102, and it is therefore possible to reduce the effect of the Q-value of the capacitance and to achieve a Doherty amplifier with higher efficiency.

In addition, in a case where not only the effect of the Q-value of the capacitance 55 or 56 in the circuit but also an effect of a Q-value of the capacitance 82 or 84 are large, this capacitance can be replaced with a capacitance that uses a gap between lines on a substrate.

Furthermore, although a radial stub is used in place of an inductance in the third example, an open stub with a length from $\lambda/4$ to $\lambda/2$ may be used in place of the radial stub.

FOURTH EXAMPLE

FIG. 13 illustrates the configuration of a wireless transmitter according to a fourth example. The wireless transmitter of this example is configured by using a plurality of any of the Doherty amplifiers 10, 10A, 10B, and 10C described above in its final stage, and further includes an exciter 111, a preamplifier 112, a distributer 113, and a combiner 115.

To the exciter 111, an MPEG-2 transport stream (TS) is input from an interface, such as DVB-ASI. The exciter 111 then outputs a carrier wave with a radio frequency modulated in 8VSB modulation. The exciter 111 has a configuration in which a TS processor 121, a 8VSB modulator 122, a predistorter 123, and an upconverter 124 are coupled in series. The TS processor 121 monitors the rate of the input TS, inserts or removes a NULL packet as appropriate, and re-embeds a PCR. The 8VSB modulator 122 performs processing, for example, framing and concatenated coding for the processed TS, inserts a pilot signal, performs 8VSB modulation, and performs filtering with RRC (Root Raised cosine) characteristics. The predistorter 123 provides distortion opposite to distortion that is generated in a subsequent circuit or the like, to a modulation signal and outputs a resultant signal. A main place where distortion is generated is the Doherty amplifier 10 or the like. As a feature of the present example, the predistorer 123 can generate inverse characteristics of the distortion including the frequency-phase characteristics of an output capacitance compensating circuit formed by the inductances 31 and 41 and the capacitances 42, for example. Such inverse characteristics are represented by Volterra series. Typically, the series is calculated in real time by being held in an LUT (look-up table). The upconverter 124 up-converts the pre-distorted modulation signal to have a radio frequency and outputs a resultant signal.

The preamplifier 112 amplifies the radio-frequency signal that is an output of the exciter 111, to required power.

The distributor 113 is configured by a combination of a plurality of T-junctions, a hybrid coupler, and a Wilkinson distributor, for example, and equally distributes power to the number of the Doherty amplifiers 10 or the like that are included.

The combiner 115 combines outputs of the plurality of Doherty amplifiers 10 or the like into one. In a case of using the hybrid coupler in the distributer 113, since a phase difference appears in its distributed signals with predetermined regularity, the distributed signals have to be combined with a phase difference corresponding to that phase difference.

In this example, all the preamplifier 112, the distributer 113, the Doherty amplifier 10 or the like, and the combiner 115 are designed to have input and output impedances of 50 ohms.

Although the description is provided in the first to third examples by using an FET as a transistor, the same effects can be also obtained by using another transistor, such as a bipolar transistor.

Further, in the first to third examples, a circuit for reducing an output capacitance of a transistor is coupled to each of a carrier amplifier and a peak amplifier. This configuration enables symmetry to be maintained when both the carrier amplifier and the peak amplifier operate, and therefore favorable characteristics can be obtained. However, if an appropriate load impedance can be set when an input signal is large and the peak amplifier side also operates, it is possible to omit the circuit for reducing the output capacitance of the transistor on the peak amplifier side, thereby simplifying a circuit.

In the above, the invention made by the inventors has been specifically described by way of the embodiments and examples. However, it is naturally understood that the present invention is not limited to the aforementioned embodiments and examples, and can be changed in various ways.

REFERENCE SIGNS LIST

1: carrier amplifier, 1T: transistor, 2: peak amplifier, 2T: transistor, 3: load, 4: impedance transformer matching circuit, 5: λ/4 transmission line (impedance transforming line), 7: λ/4 transmission line (phase adjusting circuit), 10, 10A, 10B, 10C: Doherty amplifier (power amplifier), 31: inductance (first inductance), 32: inductance (third inductance), 41: inductance (second inductance), 42: capacitance (first capacitance), 43: inductance (fourth inductance), 44: capacitance (fourth capacitance), 51: inductance (first inductance), 52: inductance (third inductance), 53, 54: FET, 55: capacitance (second capacitance), 56: capacitance (fourth capacitance), 57, 58: power supply line, 71, 72, 73, 74: transmission line, 81: inductance (second inductance), 83: inductance (fourth inductance), 82: capacitance (first capacitance), 84: capacitance (third capacitance), 91: transistor, 92: output capacitance, 93: inductance, 94 capacitance, 101, 102: radial stub, 104, 105: inductance

The invention claimed is:

1. A power amplifier includes:
a carrier amplifier that amplifies an input signal;
a peak amplifier that starts to amplify the input signal when a signal level of the input signal becomes a predetermined level or more;
a phase adjusting circuit that adjusts phases of an output of the carrier amplifier and an output of the peak amplifier;
an impedance transforming line that transforms a load of the carrier amplifier when the signal level of the input signal is smaller than the predetermined level;
a first inductance having one terminal coupled to an output of a first transistor forming the carrier amplifier and another terminal grounded in an alternating-current manner; and
a serial resonant circuit in which a second inductance and a first capacitance are coupled in series between the first inductance and the impedance transforming line, wherein
the impedance transforming line has an approximately equal characteristic impedance to an optimum load impedance of the carrier amplifier when the signal level is the predetermined level or more, at a coupling point of the impedance transforming line and the serial resonant circuit.

2. The power amplifier according to claim 1, further comprising:
an input signal terminal;
an output terminal intended to be coupled to a 50-ohm resistance load;
a distributing circuit that distributes the input signal input to the input signal terminal;
a second capacitance that is coupled between the other terminal of the first inductance and an earth terminal and is sufficiently large with respect to a signal frequency; and
an impedance transformer matching circuit that is arranged between the impedance transforming line and the output terminal and transforms ½ of the optimum load impedance of the carrier amplifier to substantially the 50 ohms, wherein
the impedance transforming line has an electric length of approximately λ/4 at a center frequency, and
the phase adjusting circuit is arranged between the distributing circuit and the peak amplifier.

3. The power amplifier according to claim 2, wherein
the first inductance is chosen to such a value that the first inductance resonant in parallel with an output capacitance of the first transistor around the center frequency, and values of the second inductance and the first capacitance in the serial resonance circuit are chosen to cause serial resonance around the center frequency, and
a circuit network including a parallel resonant circuit, which includes the first inductance and the output capacitance, and the serial resonant circuit cancels the output capacitance over a band around the center frequency while maintaining a conductance of the first transistor, and couples the first transistor and the impedance transforming line to each other.

4. The power amplifier according to claim 3, wherein
the values of the second inductance and the first capacitance in the serial resonance circuit are chosen in such a manner that imaginary parts of frequency derivatives of respective impedances or admittances of the parallel resonance circuit and the serial resonance circuit are approximately equal to each other in magnitude and are opposite to each other in sign around the center frequency.

5. The power amplifier according to claim 2, wherein
one terminal of a third inductance is coupled to near an output terminal of a second transistor forming the peak amplifier,
a fourth inductance and a third capacitance are coupled in series between a point at which the output terminal of the second transistor and the third inductance are coupled to each other, and the impedance transformer matching circuit, and
another terminal of the third inductance is grounded via a fourth capacitance that is sufficiently large with respect to a signal frequency.

6. The power amplifier according to claim 5, further comprising:
a first matching circuit arranged between the distributing circuit and a gate of the first transistor; and
a second matching circuit arranged between the phase adjusting circuit and a gate of the second transistor, wherein
each of the first and second transistors is an FET.

7. The power amplifier according to claim 3, wherein either or both of the first inductance and the second inductance is simulated by a transmission line.

8. The power amplifier according to claim 5, wherein
the one terminal of the first inductance is coupled to near an output terminal of the first transistor, and
a transmission line simulating the first inductance also functions as a power supply line that applies a bias to the first transistor.

9. A radio transmitter using the power amplifier according to claim 2, comprising a predistorter that provides distortion opposite to distortion to be generated in the power amplifier, to an input signal to the power amplifier, wherein the opposite distortion includes opposite characteristics of distortion affected by providing at least the first and second inductances and the first capacitance.

* * * * *